(12) United States Patent
Mizoguchi

(10) Patent No.: US 10,591,551 B2
(45) Date of Patent: Mar. 17, 2020

(54) VOLTAGE DETECTION APPARATUS

(71) Applicant: DENSO CORPORATION, Kariya, Aichi pref. (JP)

(72) Inventor: Hayato Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 277 days.

(21) Appl. No.: 15/699,528

(22) Filed: Sep. 8, 2017

(65) Prior Publication Data

US 2018/0074127 A1   Mar. 15, 2018

(30) Foreign Application Priority Data

Sep. 12, 2016  (JP) ................... 2016-177957

(51) Int. Cl.

| | |
|---|---|
| *G01R 31/3835* | (2019.01) |
| *G01R 31/396* | (2019.01) |
| *H01M 10/48* | (2006.01) |
| *G01R 19/165* | (2006.01) |
| *H01M 2/34* | (2006.01) |
| *H02H 3/20* | (2006.01) |
| *H02H 7/18* | (2006.01) |

(52) U.S. Cl.
CPC ... *G01R 31/3835* (2019.01); *G01R 19/16542* (2013.01); *G01R 31/396* (2019.01); *H01M 2/34* (2013.01); *H01M 10/48* (2013.01); *H01M 10/482* (2013.01); *H02H 3/20* (2013.01); *H01M 2200/00* (2013.01); *H02H 7/18* (2013.01)

(58) Field of Classification Search
CPC ...... H01M 2/34; H01M 10/48; H01M 10/482; H01M 2200/00; H02H 3/20; H02H 7/18; G01R 31/362; G01R 31/3658; G01R 31/3835; G01R 31/396; G01R 19/16542
USPC ....................................................... 361/91.6
See application file for complete search history.

(56) References Cited

U.S. PATENT DOCUMENTS

| | | |
|---|---|---|
| 2013/0342939 A1 | 12/2013 | Itou et al. |
| 2014/0147713 A1 | 5/2014 | Mizobe et al. |

*Primary Examiner* — Kevin J Comber
(74) *Attorney, Agent, or Firm* — Oliff PLC

(57) ABSTRACT

A voltage detection apparatus is provided which is suitable for an assembled battery including a series connection of battery cells. The apparatus includes a monitoring section having battery input sections, a high-potential connection section, a low-potential connection section, and a main voltage detection section; a high-potential electrical path; a low-potential electrical path; a control section that includes a high-potential input section electrically connected to the high-potential connection section, a low-potential input section electrically connected to the low-potential connection section, and a sub voltage detection section that detects a voltage difference between the high-potential input section and the low-potential input section as a terminal voltage of a detection block; a high-potential switch that is provided in the high-potential electrical path to open and close the high-potential electrical path; and a low-potential switch that is provided in the low-potential electrical path to open and close the low-potential electrical path.

5 Claims, 6 Drawing Sheets

VOLTAGE DETECTION APPARATUS

CROSS-REFERENCE TO RELATED APPLICATION

This application is based on and claims the benefit of priority from earlier Japanese Patent Application No. 2016-177957 filed Sep. 12, 2016, the description of which is incorporated herein by reference.

BACKGROUND

Technical Field

The present invention relates to a voltage detection apparatus suitable for an assembled battery including a series connection of a plurality of battery cells.

Related Art

Conventionally, a voltage detection apparatus is known which detects terminal voltages of battery cells that constitute an assembled battery, for example as described in JP-A-2014-107979. The assembled battery that is subjected to voltage detection by the voltage detection apparatus has a plurality of detection blocks, each of which is a series connection formed of at least two battery cells.

The voltage detection apparatus includes a monitoring section and a control section that controls the monitoring section. The monitoring section includes a main voltage detection section that detects, for example, respective terminal voltages of the battery cells of the detection blocks.

The control section includes a sub voltage detection section that detects terminal voltages of the detection blocks. The purpose of the sub voltage detection section is to provide redundancy in the voltage detection configuration, for improved stability of functions of the voltage detection apparatus.

The above voltage detection apparatus is equipped with electrical paths that are respectively connected to the positive electrode terminal side and the negative electrode terminal side of the voltage detection block, and switches respectively provided to the electrical paths. The control section selects, from the plurality of detection blocks, a detection block whose terminal voltage is to be detected. The control section then commands a closing operation of the switches provided to the pair of electrical paths connected to the selected detection block. With these switches in the closed state, the sub voltage detection section then detects a terminal voltage of the detection block through the pair of electrical paths.

Each of the detection blocks is provided with a pair of electrical paths for voltage detection. These electrical paths are connected to the sub voltage detection section via an input section provided to the control section. Since the control section mainly outputs switch operation commands, it can be considered that a control section is provided for the switches. In this case, it is only necessary to provide a number of input sections to the control section that is equal to the number of the electrical paths. However, in this configuration, if the number of detection blocks is changed due to a change in specifications of the assembled battery, it becomes necessary to also change the number of input sections of the control section. As a result, it becomes necessary to change the structure of the control section. This is undesirable from the viewpoint of achieving commonality of parts.

SUMMARY

An embodiment provides a voltage detection apparatus that is suitable for an assembled battery and that achieves commonality of parts.

As an aspect of the embodiment, a voltage detection apparatus is provided which is suitable for an assembled battery including a series connection of a plurality of battery cells. The series connection including at least two of the battery cells configuring the assembled battery is regarded as at least one detection block. The voltage detection apparatus includes: at least one monitoring section that has battery input sections, a high-potential connection section, a low-potential connection section, and a main voltage detection section that detects a terminal voltage of a detection target battery, the detection target battery being each of the battery cells configuring the detection block or the series connection of the battery cells, the number of which is smaller than the number of the battery cells configuring the detection block; a high-potential electrical path that is provided in the monitoring section and electrically connects the high-potential connection section and a positive electrode side of the detection block via the battery input section; a low-potential electrical path that is provided in the monitoring section and electrically connects the low-potential connection section and a negative electrode side of the detection block via the battery input section; a control section that includes a high-potential input section electrically connected to the high-potential connection section, a low-potential input section electrically connected to the low-potential connection section, and a sub voltage detection section that detects a voltage difference between the high-potential input section and the low-potential input section as a terminal voltage of the detection block; a high-potential switch that is provided in the high-potential electrical path to open and close the high-potential electrical path; and a low-potential switch that is provided in the low-potential electrical path to open and close the low-potential electrical path.

DETAILED DESCRIPTION OF THE PREFERRED EMBODIMENTS

First Embodiment

The first embodiment of a voltage detection apparatus will be described with reference to the drawings. The voltage detection apparatus is applied to a power supply system that is installed in, for example, a hybrid vehicle or an electric vehicle.

Figure 1:
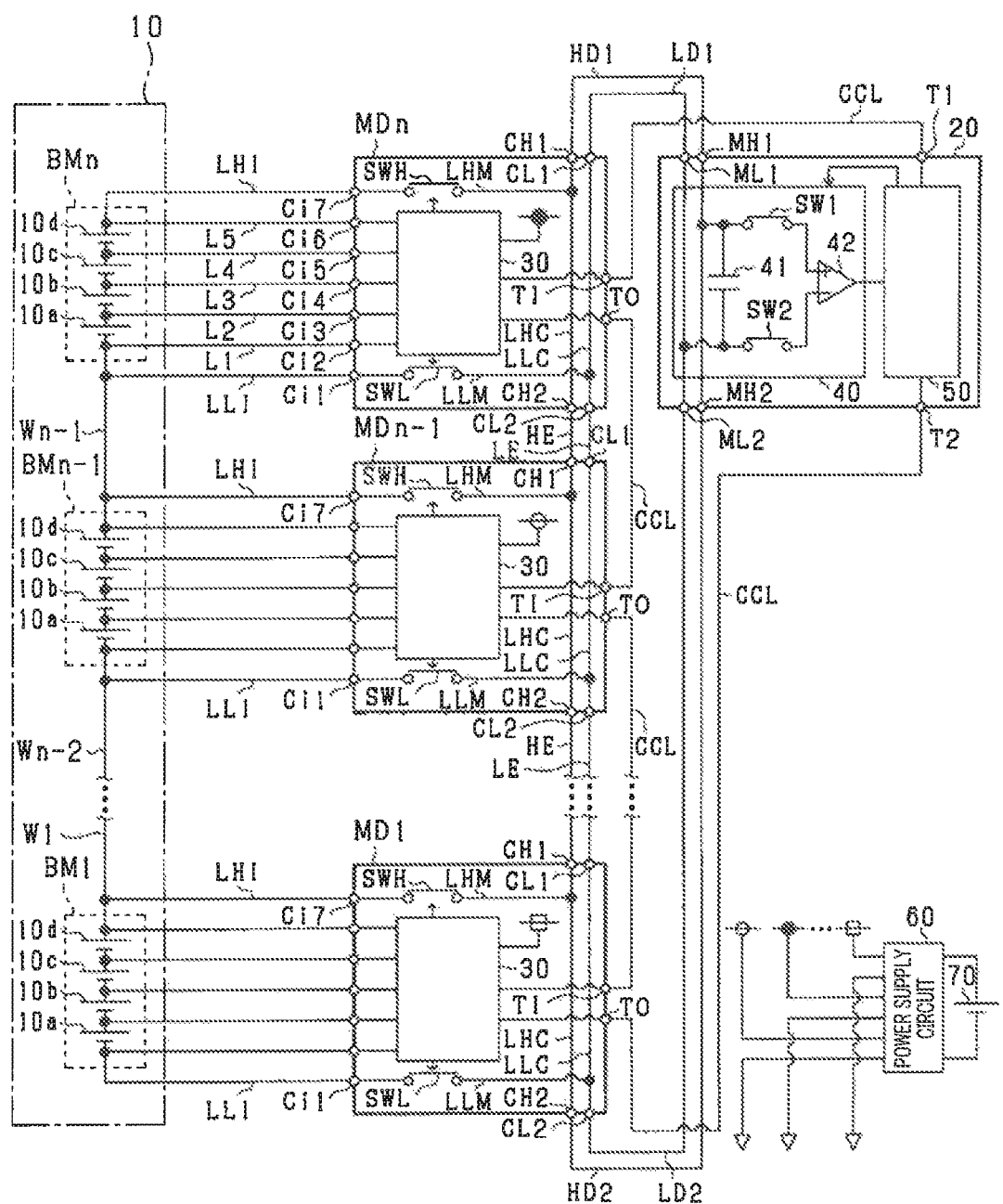
FIG. 1 is a diagram showing the overall configuration of a power supply system according to a first embodiment.

As shown in FIG. 1, the power supply system includes an assembled battery 10. The assembled battery 10 provides an electric power source for in-vehicle electrical loads including a traction motor (not shown) of a vehicle. The assembled battery 10 includes a series connection of battery cells, which are unit cells, and provides a voltage across terminals of, for example, several hundred volts. The battery cell may be a storage battery such as a lithium-ion battery.

In the present embodiment, a series connection of at least two battery cells, which are included in the battery cells constituting the assembled battery 10, is integrated into a battery module serving as a detection block. In the present embodiment, a series connection of four battery cells 10a to 10d constitutes a battery module. In addition, a series connection of n battery modules constitutes the assembled battery 10, where n is assumed to be an integer of 3 or more. It is noted that, in the present embodiment, the battery modules constituting the assembled battery 10 are referred to, in sequence, from the low-potential side battery module, as a first battery module BM1, a second battery module BM2, . . . , an (n−1)-th battery module BMn−1, and an n-th battery module BMn.

The voltage detection apparatus includes first to n-th monitoring sections MD1 to MDn and a control section 20. The monitoring sections MD1 to MDn are provided so as to individually correspond to the battery modules BM1 to BMn.

Here, m is defined as an integer of 1 to n−1. The positive electrode side of the m-th battery module BMm and the negative electrode side of the (m+1)-th battery module BMm+1, which is adjacent (at the high-potential side) to the battery module BMm, are electrically connected by an m-th conductive member Wm. In the present embodiment, the m-th conductive member Wm is a wire serving as a conductive member.

Next, the first to n-th monitoring sections MD1 to MDn will be described. In the present embodiment, the monitoring sections MD1 to MDn have the same configuration. Hence, only the configuration of the n-th monitoring section MDn will be described as an example. For convenience, the reference numerals designating respective members of the monitoring section are used in common for the monitoring sections MD1 to MDn.

The n-th monitoring section MDn has a circuit board, to which first to seventh battery input sections Ci1 to Ci7, a first high-potential connection section CH1, a second high-potential connection section CH2, a first low-potential connection section CL1, and a second low-potential connection section CL2 are provided. The input sections Ci1 to Ci6 and the connection sections CH1, CH2, CL1, CL2 are configured as terminals.

The circuit board of the n-th monitoring section MDn is also provided with a high-potential electric path LHM, a low-potential electric path LLM, a high-potential common path LHC, and a low-potential common path LLC. The high-potential common path LHC is electrically connected to the first high-potential connection section CH1 and the second high-potential connection section CH2, while the low-potential common path LLC is electrically connected to the first low-potential connection section CL1 and the second low-potential connection section CL2. The high-potential electric path LHM electrically connects the seventh battery input section Ci7 and the high-potential common path LHC, while the low-potential electric path LLM electrically connects the first battery input section Ci1 and the low-potential common path LLC.

The seventh battery input section Ci7 of the n-th monitoring section MDn is connected with the positive electrode side of the n-th battery module BMn via a high-potential input path LHI, while the first battery input section Ci1 of the n-th monitoring section MDn is connected with the negative electrode side of the n-th battery module BMn via a low-potential input path LLI.

A second battery input section Ci2 is connected with the negative electrode side of a first battery cell 10a via a first input path L1, and a third battery input section Ci3 is connected with the positive electrode side of the first battery cell 10a and the negative electrode side of the second battery cell 10b via a second input path L2. A fourth battery input section Ci4 is connected with the positive electrode side of the second battery cell 10b and the negative electrode side of a third battery cell 10c via a third input path L3. A fifth battery input section Ci5 is connected with the positive electrode side of the third battery cell 10c and the negative electrode side of a fourth battery cell 10d via a fourth input path L4. A sixth battery input section Ci6 is connected with the positive electrode side of the fourth battery cell 10d via a fifth input path L5.

The paths LLI, L1 to L6 and LHI may be integrated into a harness member in a state of being electrically insulated from each other. In addition, in FIG. 1, reference numerals of the second to sixth battery input sections Ci2 to Ci6 and the first to fifth input paths L1 to L5, which correspond to the first to (n−1)-th monitoring sections MD1 to MDn−1, are omitted for convenience.

A main voltage detection section 30 is provided to the circuit board of the n-th monitoring section MDn, and is an integrated circuit. The main voltage detection section 30 has a function of individually detecting terminal voltages of the respective battery cells 10a to 10d constituting the n-th battery module BMn. That is, in the present embodiment, each of the battery cells is a detection target battery. The main voltage detection section 30 detects the terminal voltage of the first battery cell 10a via the first input path L1 and second input path L2, and detects the terminal voltage of the second battery cell 10b via the second input path L2 and third input path L3. In addition, the main voltage detection section 30 detects the terminal voltage of the third battery cell 10c via the third input path L3 and fourth input path L4, and detects the terminal voltage of the fourth battery cell 10d via the fourth input path L4 and fifth input path L5. The main voltage detection section 30 includes an A/D converter, and converts the detected terminal voltage from analog data to digital data.

In the n-th monitoring section MDn, a high-potential switch SWH is provided to the high-potential electric path LHM and a low-potential switch SWL is provided to the low-potential electrical path LLM. In the present embodiment, each of the switches SWH, SWL is a normally-open type relay. The switches SWH, SWL are operated so as to be opened and closed by the main voltage detection section 30.

Next, the control section 20 will be described.

The control section 20 includes a circuit board, on which a first high-potential input section MH1, a second high-potential input section MH2, a first low-potential input section ML1, a second low-potential input section ML2, a sub voltage detection section 40 and a processing section 50 are provided. In the present embodiment, the processing section 50 is an integrated circuit. In addition, in the present embodiment, each of the input sections MH1, MH2, ML1, ML2 is configured as a terminal.

The sub voltage detection section 40 uses a flying capacitor system, and includes a capacitor 41, a first switch SW1, a second switch SW2, and an amplifier 42. In the present embodiment, the first switch SW1 and the second switch SW2 are normally-open type relays. The first switch SW1 and the second switch SW2 are operated so as to be opened and closed by the processing section 50.

The first terminal of the capacitor 41 is connected to the first high-potential input section MH1 and to the second high-potential input section MH2. The second terminal of the capacitor 41 is connected to the first low-potential input section ML1 and the second low-potential input section ML2.

The first terminal of the capacitor 41 is also connected via the first switch SW1 to the non-inverting input terminal of the amplifier 42, while the second terminal of the capacitor 41 is connected via the second switch SW2 to the inverting input terminal of the amplifier 42. The output voltage of the amplifier 42 is inputted to the processing section 50.

Next, connections between the monitoring sections MD1 to MDn and the control section 20 will be described.

The first high-potential connection section CH1 of the m-th monitoring section MDm (m=1, 2, ..., n−1) and the second high-potential connection section CH2 of the (m+1)-th monitoring section MDm+1 are connected by the high-potential external path HE, and the first low-potential connection section CL1 of the m-th monitoring section MDm and the second low-potential connection section CL2 of the (m+1)-th monitoring section MDm+1 are connected by the low-potential external path LE.

The first high-potential input section MH1 of the control section 20 is connected via the first high-potential detection path HD1 to the first high-potential connection section CH1 of the n-th monitoring section MDn, while first low-potential input section ML1 of the control section 20 is connected via the first low-potential detection path LD1 to the first low-potential connection section CL1 of the n-th monitoring section MDn. In the present embodiment, the high-potential external path HE and the low-potential external path LE are integrated into a harness member in a state of being electrically insulated from each other.

The first high-potential connection section CH1 of the n-th monitoring section MDn is connected to the first high-potential input section MH1 of the control section 20 via the first high-potential detection path HD1, while the first low-potential connection section CL1 of the n-th monitoring section MDn is connected to the first low-potential input section ML1 of the control section 20 via the first low-potential detection path LD1. In the present embodiment, the first high-potential detection path HD1 and the first low-potential detection path LD1 are integrated into a harness member.

The second high-potential input section MH2 of the control section 20 is connected via the second high-potential detection path HD2 to the second high-potential connection section CH2 of the first monitoring section MD1, while second low-potential input section ML2 of the control section 20 is connected via the second low-potential detection path LD2 to the second low-potential connection section CL2 of the first monitoring section MD1. In the present embodiment, the second high-potential detection path HD2 and the second low-potential detection path LD2 are integrated into a harness member.

The control section 20 is provided with a first communication connection section T1 and a second communication connection section T2 as terminals. Each of the first to n-th monitoring sections MD1 to MDn is also provided with a communication input section TI and a communication output section TO as terminals.

The processing section 50 and the first to n-th monitoring sections MD1 to MDn have a communication function. Connections are respectively established by a communication line CCL between the first communication connection section T1 of the control section 20 and the communication input section TI of the n-th monitoring section MDn, between the communication output section TO of the (m+1)-th monitoring section MDm+1 (m=1, 2, ..., n−1) and the communication input section TI of the m-th monitoring section MDm, and between the communication output section TO of the first monitoring section MD1 and the second communication connection section T2 of the control section 20. That is, connections are established between the control section 20 and the first to n-th monitoring sections MD1 to MDn by a daisy chain system.

The terminal voltages of the respective battery cells that are detected by the monitoring sections MD1 to MDn as digital data are inputted to the processing section 50 via the communication line CCL and the second communication connection section T2.

The power supply system includes a power supply circuit 60 that generates a power supply voltage for the monitoring sections MD1 to MDn and the control section 20. In the present embodiment, the power supply circuit 60 configures a power supply system, which generates a power supply voltage using a low voltage storage battery 70 as an electric power source, where the low voltage storage battery 70 produces a lower voltage than the rated voltage of the assembled battery 10. A lead storage battery, for example, may be used as the low voltage storage battery 70.

Next, a method of detecting the terminal voltages of the battery modules by the sub voltage detection section 40 will be described with reference to FIG. 2. For convenience, FIG. 2 shows as an example of the method of detecting the terminal voltages of the first to third battery modules BM1 to BM3, which correspond to the first to third monitoring sections MD1 to MD3.

Figure 2:
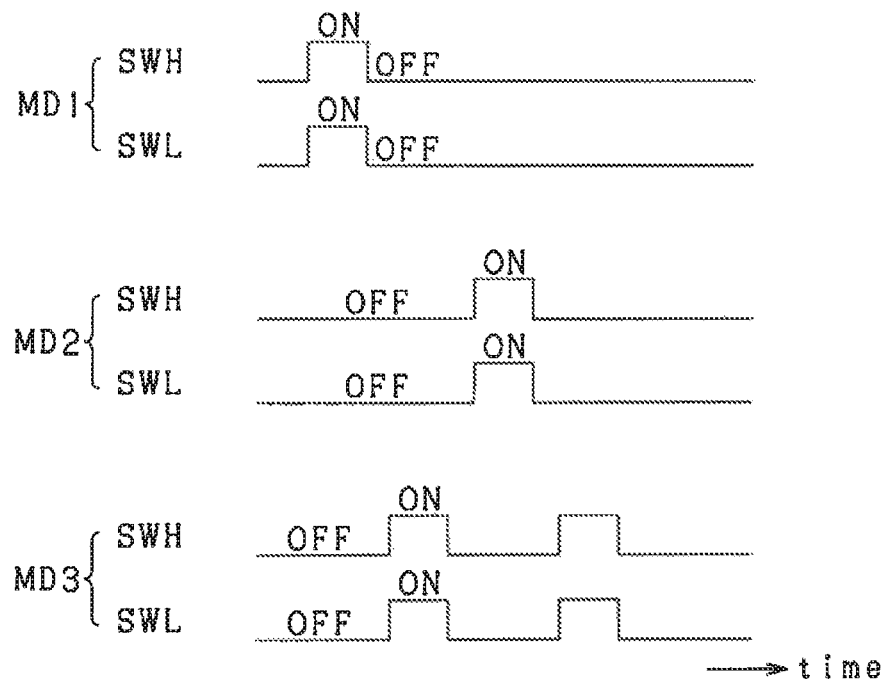
FIG. 2 is a timing diagram of an example of open/closed states of switches.

In the example shown in FIG. 2, first, a closing operation command for (command for closing) the high-potential switch SWH and the low-potential switch SWL of the first monitoring section MD1 included in the monitoring sections MD1 to MDn is outputted from the processing section 50 via the first communication connection section T1 and the communication line CCL.

The closing operation command is inputted to the main voltage detection section 30 of the first monitoring section MD1 via the communication line CCL and the communication input section TI. Hence, the high-potential switch SWH and the low-potential switch SWL of the first monitoring section MD1 are closed by the main voltage detection section 30. Thereby, the terminal voltage of the capacitor 41 becomes identical to the terminal voltage of the first battery module BM1 or identical to a voltage that is in accordance with that terminal voltage. The first switch SW1 and the second switch SW2 are then temporarily closed by the processing section 50, and a voltage that is in accordance with the terminal voltage of the capacitor 41 is outputted from the amplifier 42. The terminal voltage of the first battery module BM1 is then detected by the processing section 50 based on the output voltage of the amplifier 42. Then, the high-potential switch SWH and the low-potential switch SWL of the first monitoring section MD1 are opened.

Thereafter, a closing operation command for the high-potential switch SWH and the low-potential switch SWL of the third monitoring section MD3 is outputted from the processing section 50 via the communication connection section T1 and the communication line CCL.

The closing operation command supplied via the communication line CCL and the communication input section T1 is inputted to the main voltage detection section 30 of the third monitoring section MD3. As a result, the high-potential switch SWH and the low-potential switch SWL of the third monitoring section MD3 are closed by the main voltage detection section 30. Hence, the terminal voltage of the capacitor 41 becomes identical to the terminal voltage of the third battery module BM3 or identical to a voltage that is in accordance with that terminal voltage. The terminal voltage of the third battery module BM3 is then detected by the processing section 50 in the same manner as described for the first monitoring section MD1.

Thereafter, the high-potential switch SWH and the low-potential switch SWL of the third monitoring section MD3 are opened. Thereafter, a closing operation command for the high-potential switch SWH and the low-potential switch SWL of the second monitoring section MD2 is outputted from the processing section 50 via the communication connection section T1 and the communication line CCL. Thereafter, in the same manner as described for the first monitoring section MD1, the terminal voltage of the second battery module BM2 is detected.

Effects of the embodiment described above will be described.

In each of the monitoring sections MD1 to MDn, the high-potential switch SWH is provided to the high-potential electrical path LHM, and the low-potential switch SWL is provided to the low-potential electrical path LLM. According to this configuration, it is only necessary to provide one first high-potential input section MH1 and one first low-potential input section ML1 in the control section 20. That is, it is not necessary to provide the same number of first high-potential input sections MH1 and of first low-potential input section ML1 as the number n of monitoring sections. In addition, it is only necessary to provide one second high-potential input section MH2 and one second low-potential input section ML2 in the control section 20. That is, it is not necessary to provide the same number of second high-potential input sections MH2 and of second low-potential input sections ML2 as the number n. Hence, according to the present embodiment, even if the number of battery modules has been changed due to change in the specifications, such as capacity, of the assembled battery 10, it is not necessary to change the number of each of the input sections MH1, ML1, MH2, ML2 of the control section 20 from one. Accordingly, according to the present embodiment, even if the specifications of the assembled battery 10 have been changed, commonality of the control section 20 of the voltage detection apparatus can be achieved.

In each of the monitoring sections MD1 to MDn, the high-potential common path LHC connecting the first high-potential connection section CH1 and the second high-potential connection section CH2 and the low-potential common path LLC connecting the first low-potential connection section CL1 and the second low-potential connection section CL2 are provided. The first high-potential connection section CH1 of the n-th monitoring section MDn is connected to the first high-potential input section MH1 of the control section 20 via the first high-potential detection path HD1. In addition, the first low-potential connection section CL1 of the n-th monitoring section MDn is connected to first low-potential input section ML1 of the control section 20 via the first low-potential detection path LD1.

Furthermore, the first high-potential connection section CH1 of the m-th monitoring section MDm (m=1, 2, n-1) and the second high-potential connection section CH2 of the (m+1)-th monitoring section MDm+1 are connected via the high-potential external path HE, while the first low-potential connection section CL1 of the m-th monitoring section MDm and the second low-potential connection section CL2 of the (m+1)-th monitoring section MDm+1 are connected via the low-potential external path LE.

According to this configuration, for example, in the case where the positive electrode side of the (n−2)-th battery module BMn−2 and the first high-potential input section MH1 of the control section 20 are connected via the (n−2)-th monitoring section MDn−2, the high-potential common paths LHC in the (n−1)-th and n-th monitoring sections MDn−1, MDn can be used. In addition, for example in the case where the negative electrode side of the (n−2)-th battery module BMn−2 and the first low-potential input section ML1 of the control section 20 are connected via the (n−2)-th monitoring section MDn−2, the low-potential common paths LHC in the (n−1)-th and n-th monitoring sections MDn−1, MDn can be used. Hence, the electrical paths of the voltage detection apparatus can be shortened. This configuration is advantageous, in the case where the battery modules are installed in respectively separated spaces in a vehicle, to reduce harness members connecting the monitoring sections and the control section 20. Here, the separated spaces in the vehicle include, for example, spaces under the seats, and a space under the trunk compartment at the rear of the vehicle.

The second high-potential connection section CH2 of the first monitoring section MD1 is connected to the second high-potential input section MH2 of the control section 20 via the second high-potential detection path HD2, and the second low-potential connection section CL2 of the first monitoring section MD1 is connected to the second low-potential input section ML2 of the control section 20 via the second low-potential detection path LD2. According to this configuration, for example, even if a disconnection has occurred in the first high-potential detection path HD1 or the first low-potential detection path LD1, a charging path for the capacitor 41 can be ensured. Hence the reliability of voltage detection by the sub voltage detection section 40 can be enhanced.

The electric power source of the monitoring sections MD1 to MDn is the power supply circuit 60. According to this configuration, even if an anomaly has occurred in any of the battery cells 10a to 10d, the high-potential switch SWH and the low-potential switch SWL in each of the monitoring sections MD1 to MDn can be opened and closed by using the power supply voltage generated by the power supply circuit 60. Hence, even if an anomaly has occurred in a battery cell, the terminal voltages of the battery module can be detected by the sub voltage detection section 40.

Second Embodiment

Hereinafter, the second embodiment will be described with reference to the drawings, focusing on the differences from the first embodiment. In the present embodiment, a disconnected portion specifying process for specifying a disconnected portion in the communication line CCL is performed based on the voltage detected by the sub voltage detection section 40.

Figure 3:
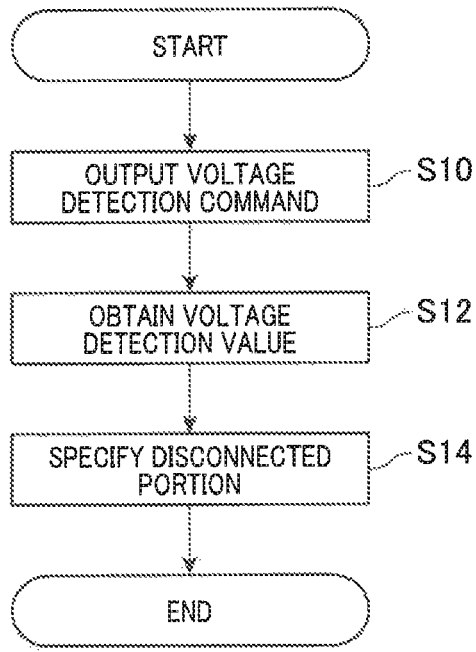
FIG. 3 is a flowchart of a procedure of a disconnected portion specifying process according to a second embodiment.

FIG. 3 shows a procedure of the disconnected portion specifying process, which is performed by the control section 20.

First, in step S10 of the process, closing operation commands for the high-potential switch SWH and the low-potential switch SWL are sequentially outputted to the monitoring sections MD1 to MDn via the communication line CCL. In the present embodiment, the processing of step S10 corresponds to a command outputting section.

Next, in step S12, a terminal voltage detection value of the battery module corresponding to the switches SWH, SWL that are closed is obtained. Specifically, the terminal voltage of the battery module corresponding to the closed switches SWH, SWL is acquired as an output voltage of the amplifier 42. Then, a terminal voltage detection value of the battery module corresponding to the closed switches SWH, SWL is obtained based on the obtained output voltage. In the present embodiment, terminal voltage detection values of the n battery modules BM1 to BMn are sequentially obtained by the processing of step S12. In the present embodiment, the processing of step S12 corresponds to a detection instruction section.

Next, in step S14, based on the detected values obtained in step S12, the disconnected portion in the communication line CCL is specified. In the present embodiment, when the terminal voltage detection values of the battery modules are examined in sequence from the first battery module BM1 to the n-th battery module BMn, if there is a battery module whose terminal voltage detection value greatly deviates from the normally expected detection value, then it is determined that a disconnection has occurred in the communication line that connects the monitoring section corresponding to that battery module and the monitoring section corresponding to the battery module that is adjacent to the high-potential side of the first-mentioned battery module. Here, the condition in which a detection value greatly deviates from the normally expected detection value is, for example, a condition in which the detection value is zero. When the disconnected portion is specified, the detection and obtainment of the terminal voltage may be halted at that time point, without detecting and obtaining the terminal voltage detection values of all of the n battery modules BM1 to BMn. It is noted that, in the present embodiment, the processing of step S14 corresponds to a specification section.

As described above, according to the present embodiment, the disconnected portion in the communication line CCL can be specified.

Third Embodiment

Figure 4:
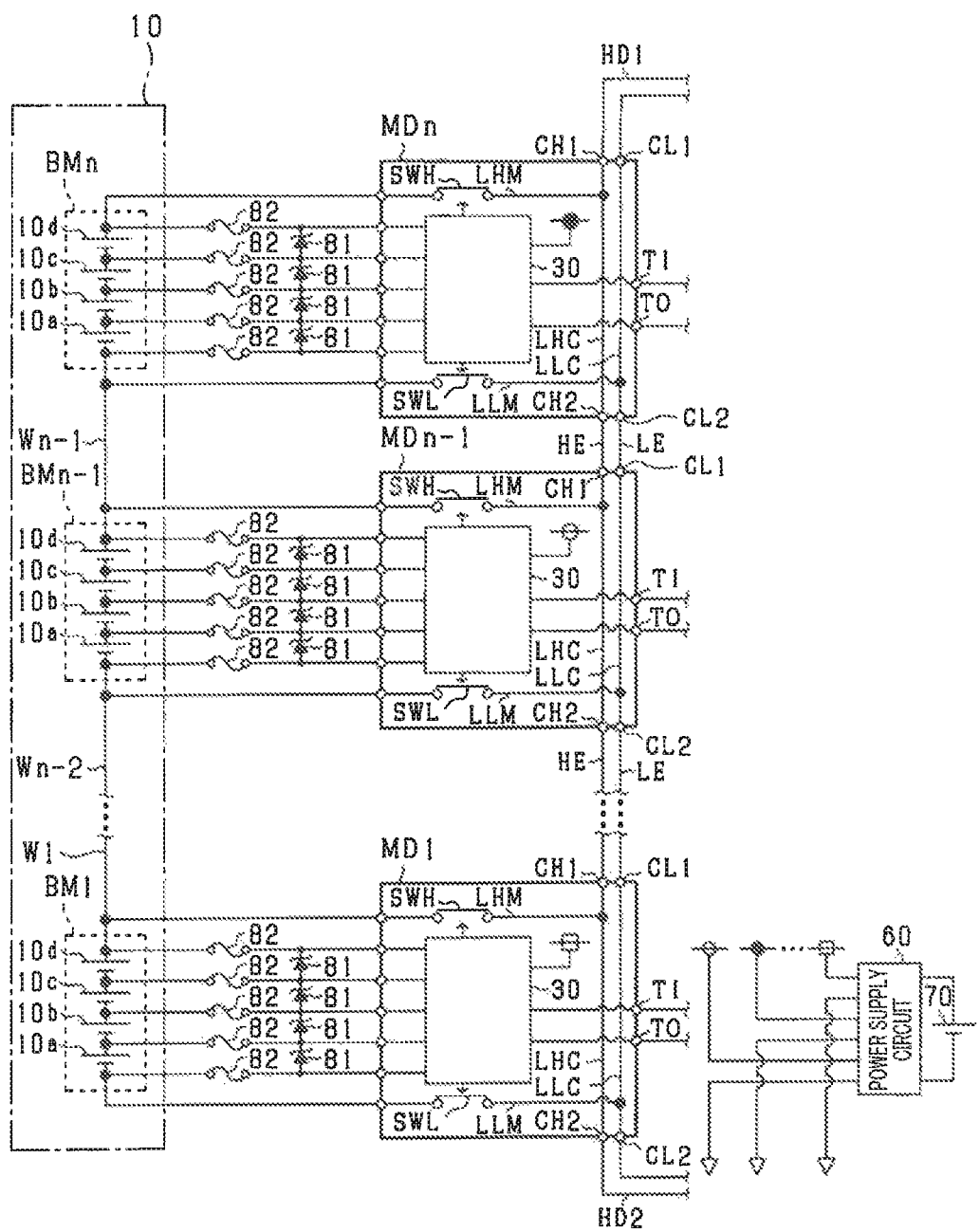
FIG. 4 is a diagram showing the overall configuration of a power supply system according to a third embodiment.

Hereinafter, the third embodiment will be described with reference to the drawings, focusing on the differences from the first embodiment. In the present embodiment, as shown in FIG. 4, protection circuits protecting the monitoring sections MD1 to MDn are provided between the assembled battery 10 and the monitoring sections MD1 to MDn. In FIG. 4, for convenience, the same components as those in FIG. 1 are denoted by the same reference numerals.

As shown in FIG. 4, in the first to fifth input paths L1 to L5 corresponding to the monitoring sections MD1 to MDn, each pair of adjacent input paths, between which a battery cell is interposed, is connected by a Zener diode 81 serving as an overvoltage protection element. Specifically, in these pairs of adjacent input paths, the high-potential side input path is connected with the cathode of the Zener diode 81, and the low-potential side input path is connected with the anode of the Zener diode 81. When an overvoltage is applied to the Zener diode 81, a short-circuit failure occurs, thereby maintaining the short-circuit between the pair of input paths that are connected to the Zener diode. It is noted that, for example, a diode described in FIG. 3 of Japanese Patent No. 5585616 may be used as the Zener diode 81.

A fuse 82 serving as a breaking element is provided in each of the first to fifth input paths L1 to L5 corresponding to the monitoring sections MD1 to MDn and between the Zener diode 81 and the battery module. The fuse 82 fuses when a current equal to or more than a predetermined value has flowed therethrough.

Next, operation of the protection circuit according to the present embodiment will be described, using as an example of the case where an overvoltage is applied between the first input path L1 and the second input path L2 of the n-th monitoring section MDn.

When an overvoltage is applied between the first input path L1 and the second input path L2, a short-circuit failure occurs in the Zener diode 81 connected between them, so that a short circuit is produced between them. As a result, an overvoltage is prevented from being applied to the n-th monitoring section MDn via the first input path L1 and the second input path L2.

When a short-circuit failure of the Zener diode 81 occurs, a closed circuit is formed which includes the second input path L2, the Zener diode 81, and the first input path L1, and a short-circuit current flows through the closed circuit. If the short-circuit current continues to flow, then, for example, either of the fuses provided in the first input path L1 and the second input path L2 will blow. As a result, the electrical connection between the first battery cell 10a and the n-th monitoring section MDn is interrupted, and the flow of the short-circuit current is halted. Accordingly, the n-th monitoring section MDn is protected from the short-circuit current.

As described above, according to the present embodiment, the n-th monitoring section MDn can be protected from an overvoltage and a short-circuit current. As a result, the reliability of the voltage detection apparatus can be prevented from lowering.

Fourth Embodiment

Figure 5:
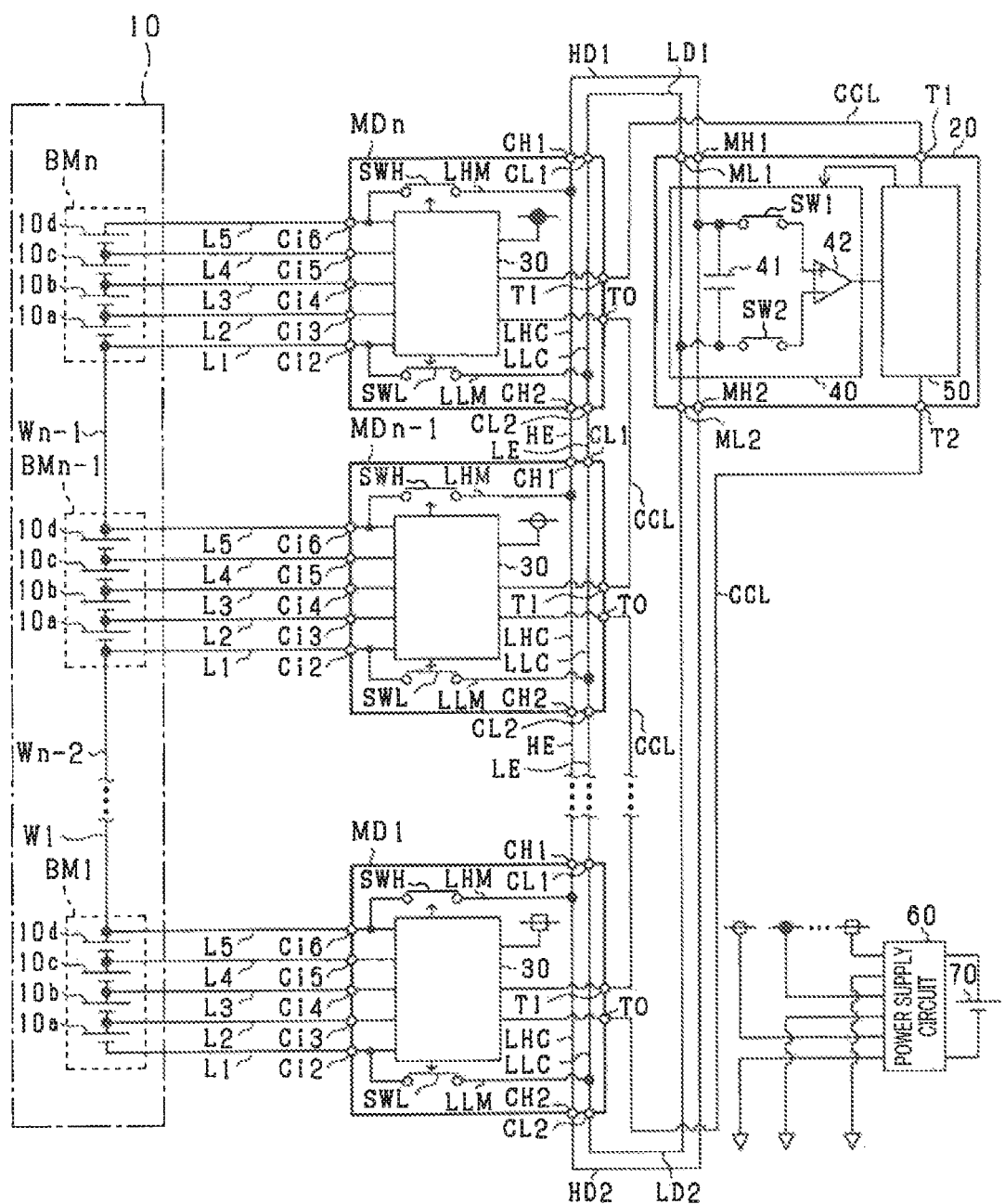
FIG. 5 is a diagram showing the overall configuration of a power supply system according to a fourth embodiment.

Hereinafter, the fourth embodiment will be described with reference to the drawings, focusing on the differences from the first embodiment. In the present embodiment, as shown in FIG. 5, the high-potential input path LHI and the low-potential input path LLI provided between the assembled battery 10 and each of the monitoring sections MD1 to MDn are omitted. According to this, the first battery input section Ci1 and the seventh battery input section Ci7 of each of the monitoring sections MD1 to MDn are omitted. In FIG. 5, for convenience, the same components as those in FIG. 1 are denoted by the same reference numerals.

As shown in FIG. 5, in each of the monitoring sections MD1 to MDn, the first terminal of the high-potential electrical path LHM is connected to the high-potential common path LHC, and the second terminal of the high-potential electrical path LHM is connected to the sixth battery input section Ci6. In addition, in each of the monitoring sections MD1 to MDn, the first terminal of the low-potential electrical path LLM is connected to the low-potential common path LLC, and the second terminal of the low-potential electrical path LLM is connected to the second battery input section Ci2.

According to the embodiment described above, the same effects as those of the first embodiment can be obtained.

Fifth Embodiment

Hereinafter, the fifth embodiment will be described with reference to the drawings, focusing on the differences from the first embodiment. In the present embodiment, the configuration of the monitoring sections MD1 to MDn is changed. Each of the monitoring sections MD1 to MDn of the present embodiment has the same configuration. Hence, only the configuration of the n-th monitoring section MDn will be described, as an example.

Figure 6:
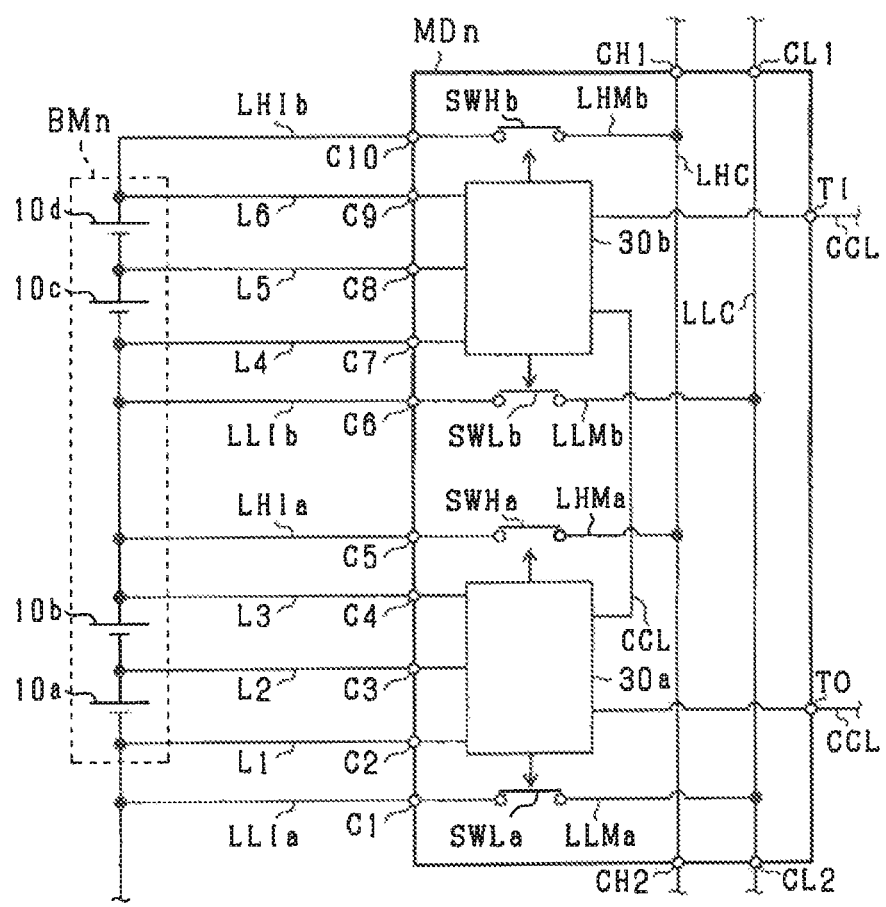
FIG. 6 is a diagram showing part of a power supply system according to a fifth embodiment.

FIG. 6 shows the configurations of the n-th battery module and the n-th monitoring section MDn of the power supply system. In FIG. 6, for convenience, the same components as those in FIG. 1 are denoted by the same reference numerals.

In the present embodiment, a first main voltage detection section 30a and a second main voltage detection section 30b are provided on the circuit board of the n-th monitoring section MDn. In the present embodiment, the main voltage detection sections 30a and 30b are integrated circuits. In addition, the first to tenth battery input sections C1 to C10 serving as terminals are provided on the circuit board of the n-th monitoring section MDn.

A first high-potential electrical path LHMa, a first low-potential electrical path LLMa, a second high-potential electrical path LHMb, and a second low-potential electrical path LLMb are provided on the circuit board of the n-th monitoring section MDn. The first high-potential electrical path LHMa connects the fifth battery input section C5 and the high-potential common path LHC, while the first low-potential electrical path LLMa connects the first battery input section C1 and the low-potential common path LLC. The second high-potential electrical path LHMb connects the tenth battery input section C10 and the high-potential common path LHC, while the second low-potential electrical path LLMb connects the sixth battery input section C6 and the low-potential common path LLC.

The fifth battery input section C5 is connected with the positive electrode side of the second battery cell 10b of the n-th battery module BMn via the first high-potential input path LHIa, and the first battery input section C1 is connected with the negative electrode side of the n-th battery module BMn via the first low-potential input path LLIa.

The tenth battery input section C10 is connected with the positive electrode side of the n-th battery module BMn via the second high-potential input path LHIb, while the sixth battery input section C6 is connected with the negative electrode side of the third battery cell 10c of the n-th battery module BMn via the second low-potential input path LLIb.

The second battery input section C2 is connected with the negative electrode side of the first battery cell 10a via the first input path L1, while the third battery input section C3 is connected with the positive electrode side of the first battery cell 10a and the negative electrode side of the second battery cell 10b via the second input path L2. The fourth battery input section C4 is connected with the positive electrode side of the second battery cell 10b via the third input path L3, while the seventh battery input section C7 is connected with the negative electrode side of the third battery cell 10c via the fourth input path L4. The eighth battery input section C8 is connected with the positive electrode side of the third battery cell 10c and the negative electrode side of the fourth battery cell 10d via the fifth input path L5. The ninth battery input section C9 is connected with the positive electrode side of the fourth battery cell 10d via the sixth input path L6.

The first main voltage detecting section 30a has functions of individually detecting terminal voltages of the first battery cell 10a via the first and second input paths L1 and L2 and detecting terminal voltages of the second battery cell 10b via the second and third input paths L2 and L3. The second main voltage detection section 30b has functions of individually detecting terminal voltages of the third battery cell 10c via the fourth and fifth input paths L4 and L5 and detecting terminal voltages of the fourth battery cell 10d via the fifth and sixth input paths L5 and L6. Each of the main voltage detection sections 30a, 30b includes an AD converter, which converts the detected terminal voltages from analog data to digital data.

A first high-potential switch SWHa is provided in the first high-potential electrical path LHMa, while a first low-potential switch SWLa is provided in the first low-potential electrical path LLMa, In addition, a second high-potential switch SWHb is provided in the second high-potential electrical path LHMb, while a second low-potential switch SWLb is provided in the second low-potential electrical path LLMb. In the embodiment, each of the switches SWHa, SWLa, SWHb, SWLb is a normally-open type relay. The first high-potential switch SWHa and the first low-potential switch SWLa are opened and closed by the first main voltage detection section 30a, while the second high-potential switch SWHb and the second low-potential switch SWLb are opened and closed by the second main voltage detection unit 30b.

According to the embodiment described above, the same effects as those of the first embodiment can be obtained.

Other Embodiments

The above embodiments may be modified as described below.

Figure 7:
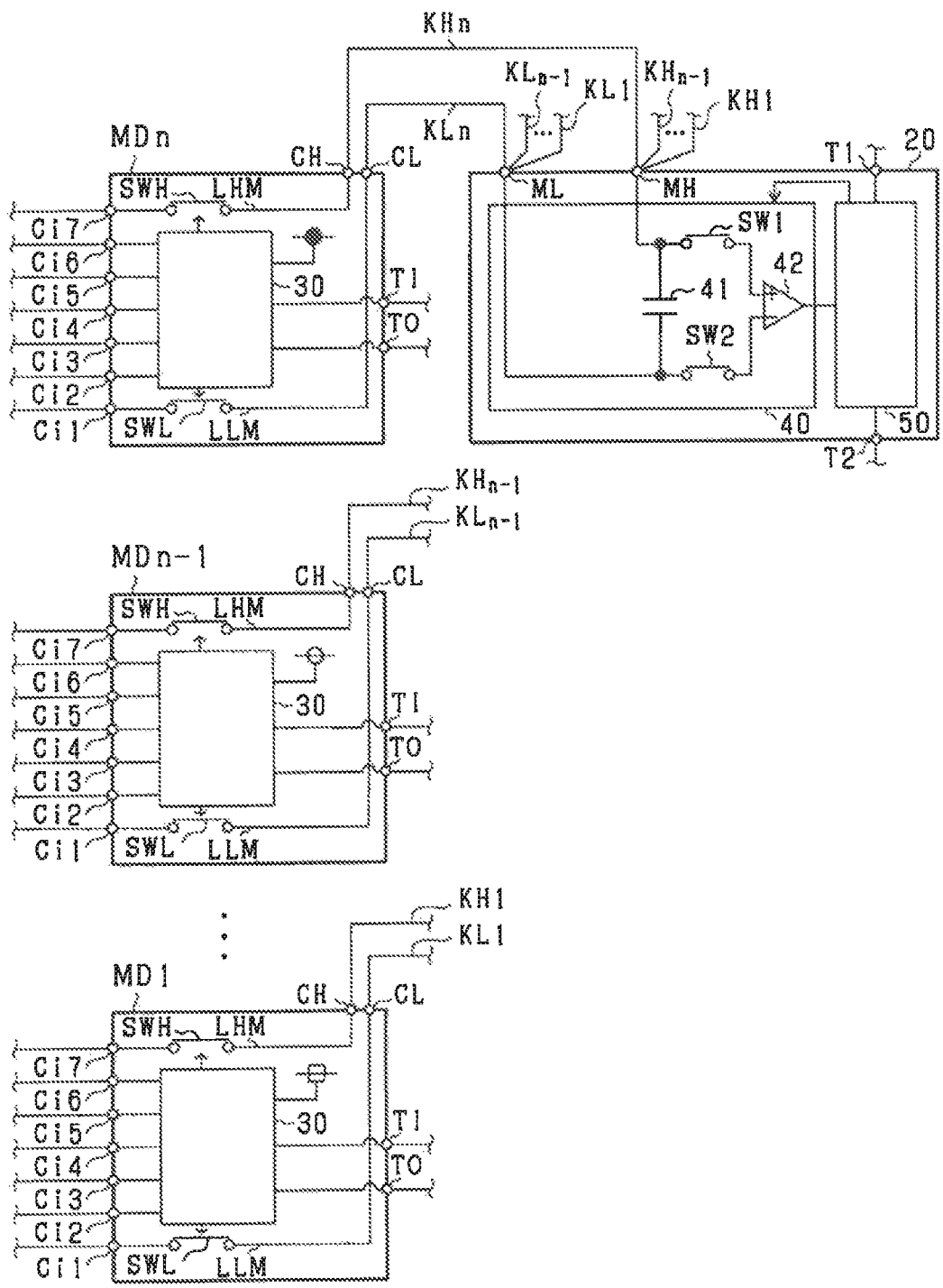
FIG. 7 is a diagram showing part of a power supply system according to another embodiment.

In the above first embodiment, for example, a configuration is provided in which the first high-potential and first low-potential connection sections CH1, CL1 of the (n−1)-th monitoring section MDn−1 are connected to the first high-potential and first low-potential input sections MH1, ML1 of the control section 20 via the high-potential and low-potential common paths LHC, LLC. However, for example, the configuration shown in FIG. 7 may be used. In FIG. 7, for convenience, the same components as those in FIG. 1 are denoted by the same reference numerals. In addition, in FIG. 7, parts of the configuration of the power supply system, for example, the assembled battery 10 and the power supply circuit 60, are omitted.

As shown in FIG. 7, a high-potential connection section CH and a low-potential connection section CL are provided on the circuit board of each of the monitoring sections MD1 to MDn. It is noted that the second high-potential connection section CH2 and the second low-potential connection section CL2 are not provided on the circuit board of each of the monitoring sections MD1 to MDn shown in FIG. 7.

A high-potential input section MH and a low-potential input section ML are provided on the circuit board of the control section 20. It is noted that the second high-potential input section MH2 and the second low-potential input section ML2 are not provided on the circuit board of the control section 20 shown in FIG. 7.

A high-potential electrical path LHM for electrically connecting the seventh battery input unit Ci7 and the high-potential connection unit CH is provided on the circuit board of each of the monitoring sections MD1 to MDn. A low-potential electrical path LLM for electrically connecting the first battery input section Ci1 and the low-potential connection section CL is provided on the circuit board of each of the monitoring sections MD1 to MDn.

The monitoring sections MD1 to MDn are connected to the control unit 20 by detection paths that are provided so as to be individually correspond thereto. Specifically, the high-potential connection sections CH of the first to n-th monitoring sections MD1 to MDn are connected with the high-potential input section MH of the control section 20 via the first to n-th high-potential detection paths KH1 to KHn. In addition, the low-potential connection sections CL of the first to nth monitoring sections MD1 to MDn are connected with the low-potential input section ML of the control section 20 via the first to n-th low-potential detection paths KL1 to KLn. According to the configuration described above, effects similar to those of the first embodiment can be obtained.

In FIG. 1 of the first embodiment, the first high-potential detection path HD1 or the second high-potential detection path HD2 may be omitted. In addition, in FIG. 1, the first low-potential detection path LD1 or the second low-potential detection path LD2 may be omitted.

In the first embodiment, for example, the control section 20 may determine whether a disconnection has occurred in the high-potential input path LHI or the low-potential input path LLI based on the terminal voltage of the n-th battery module, which is detected by the sub voltage detection section 40, and the sum of the terminal voltages of the battery cells 10a to 10d, which are detected by the main voltage detection section 30 of the n-th monitoring section MDn. Specifically, for example, if it is determined that the terminal voltage of the n-th battery module, which is detected by the sub-voltage detection section 40, is not equal to the sum of the respective terminal voltages of the battery cells 10a to 10d, which are detected by the main voltage detecting unit 30 of the n-th monitoring unit MDn, then it may be determined that a disconnection has occurred.

The method of connecting communication line between the monitoring sections and the control section is not limited to a daisy chain system. For example, it may be a bus connection, in which individual communication lines respectively connected to the monitoring units MD 1 to MDn are connected to a common communication line connected to the control section 20. In this case, the disconnected portion specifying process may be performed as below. The processing unit 50 determines whether or not, among the terminal voltage detection values of the battery modules BM1 to BMn, there is a detection value that greatly deviates from the value that is normally expected. If it is determined that there is a detection value having such a large deviation, the processing unit 50 determines that a disconnection has occurred in the individual communication line that is connected to the monitoring unit corresponding to the battery module having the large deviation. In this case, the number of individual communication lines in which a disconnection has occurred is not limited to one, and may be two or more. In addition, if it is determined that all the terminal voltage detection values of the battery modules BM1 to BMn have deviated greatly from the normally expected value, the processing unit 50 determines that a disconnection has occurred in the common communication line connected to the control unit 20.

In addition, as an example of another method of connecting communication lines between the monitoring sections and the control section, the respective monitoring sections MD1 to MDn may be connected to the control section 20 via individual communication lines. In this case, the disconnected portion specifying process may be performed as below. The processing section 50 determines whether or not there is a detection value that greatly deviates from the normally expected value, among the terminal voltage detection values of the battery modules BM1 to BMn. If it is determined that there is a greatly deviated detection value, the processing section 50 determines that a disconnection has occurred in the individual communication line connected to the monitoring section corresponding to the one of the battery modules BM1 to BMn whose terminal voltage detection value greatly deviates from the expected value.

In the first embodiment, the power supply circuit is provided outside the control section and the monitoring sections. However, for example, the power supply circuit may be provided in the control section or the monitoring section.

The breaking element is not limited to a fuse but may be an element that can interrupt the electrical connection between the monitoring section and the battery module as a result of a flow of a short-circuit current. Such an element may be, for example, a resistor, which is a resistive element that is broken by a short-circuit current, or a polyswitch.

The overvoltage protection element is not limited to a Zener diode but may be an element that produces a short-circuit failure when an excessive voltage is applied. Such an element may be, for example, a varistor.

The main voltage detection section is not limited to one that individually detects the respective terminal voltages of the battery cells constituting a battery module but may be one that detects the terminal voltage of a series connection of the battery cells, the number of which is smaller than the number of the battery cells constituting the battery module. For example, in FIG. 1, the respective terminal voltages of the series connections of two battery cells in the battery module may be detected by the main voltage detection section.

The number of battery cells constituting a battery module is not limited to four but may be two, three, or five or more. In addition, the number of battery cells constituting a battery module may not be the same in individual battery modules.

The number of battery modules constituting an assembled battery 10 is not limited to two or more but may be one. In this case, only one monitoring section may be included in the voltage detection apparatus.

The assembled battery is not limited to one that includes one series connection formed of a plurality of battery cells. For example, the assembled battery may include a plurality of series connections formed of a plurality of battery cells, the series connections being connected in parallel.

The high-potential side switch and the low-potential side switch are not limited to relays but may be, for example, N-channel MOSFETs, the sources of which are connected to each other.

The battery cell may be, for example, a nickel-hydrogen storage cell.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

As a first aspect of the embodiment, a voltage detection apparatus is suitable for an assembled battery (10) including a series connection of a plurality of battery cells (10a~10d). The series connection including at least two of the battery cells configuring the assembled battery is regarded as at least one detection block.

The voltage detection apparatus includes at least one monitoring section (MD1 to MDn) that has battery input sections (Ci1 to Ci7; C1 to C10), a high-potential connection section (CH1), a low-potential connection section (CL1), and a main voltage detection section (30; 30a, 30b) that detects a terminal voltage of a detection target battery, the detection target battery being each of the battery cells configuring the detection block or the series connection of the battery cells, the number of which is smaller than the number of the battery cells configuring the detection block; a high-potential electrical path (LHM; LHMa, LHMb) that is provided in the monitoring section and electrically connects the high-potential connection section and a positive electrode side of the detection block via the battery input section (Ci7; Ci6; C5, C10); a low-potential electrical path (LLM; LLMa, LLMb) that is provided in the monitoring section and electrically connects the low-potential connection section and a negative electrode side of the detection block via the battery input section (Ci1; Ci2; C1, C6); a control section (20) that includes a high-potential input section (MH1, MH2) electrically connected to the high-potential connection section, a low-potential input section (ML1, ML2) electrically connected to the low-potential connection section, and a sub voltage detection section (40) that detects a voltage difference between the high-potential input section and the low-potential input section as a terminal voltage of the detection block; a high-potential switch (SWH; SWHa, SWHb) that is provided in the high-potential electrical path to open and close the high-potential electrical path; and a low-potential switch (SWL; SWLa, SWLb) that is provided in the low-potential electrical path to open and close the low-potential electrical path.

At least one monitoring section has battery input sections, a high-potential connection section, a low-potential connection section, and a main voltage detection section. The monitoring section is provided with a high-potential electrical path that electrically connects the high-potential connection section and a positive electrode side of the detection block via the battery input section, and a low-potential electrical path that electrically connects the low-potential connection section and a negative electrode side of the detection block via the battery input section.

In addition, the control section includes a high-potential input section that is electrically connected to the high-potential connection section, a low-potential input section that is electrically connected to the low-potential connection section, and a sub voltage detection section that detects a voltage difference between the high-potential input section and the low-potential input section as the terminal voltage of the detection block.

In this configuration, according to the first aspect of the embodiment, a high-potential switch is provided in the high-potential electrical path of the monitoring section, for opening and closing the high-potential electrical path, and a low-potential switch is provided in the low-potential electrical path of the monitoring section, for opening and closing the low-potential electrical path. Hence, in the configuration in which a plurality of detection blocks and a plurality of monitoring sections corresponding to the respective detection blocks are provided, it is not necessary to provide high-potential input sections and low-potential input sections corresponding to the monitoring sections to the control section. Thus, even if the number of detection blocks is changed due to a change in the specifications of the assembled battery, it is not necessary to change the number of input sections of the control section. Hence, according to the first aspect of the embodiment, even if the specifications of the assembled battery are changed, commonality of the control section configuring the voltage detection apparatus can be achieved.

As a second aspect of the embodiment, the at least one detection block includes a plurality of detection blocks, and the at least one monitoring sections are provided so as to individually correspond to the detection blocks. The high-potential connection section is designated as a first high-potential connection section, and the low-potential connection section is designated as a first low-potential connection section. Each of the monitoring sections has a high-potential common path (LHC) that is electrically connected to the first high-potential connection section, a second high-potential connection section (CH2) that is electrically connected to the high-potential common path, and a low-potential common path (LLC) that is electrically connected to the first low-potential connection section, and a second low-potential connection section (CL2) that is electrically connected to the low-potential common path. The voltage detection apparatus includes: a high-potential external path (HE) that electrically connects the second high-potential connection section of the monitoring section corresponding to the detection block at a high-potential side of the adjacent detection blocks connected in series and the first high-potential connection section of the monitoring section corresponding to the detection block at a low-potential side of the adjacent detection blocks connected in series; a low-potential external path (LE) that electrically connects the second low-potential connection section of the monitoring section corresponding to the detection block at a high-potential side of the adjacent detection blocks connected in series and the first low-potential connection section of the monitoring section corresponding to the detection block at a low-potential side of the adjacent detection blocks connected in series; a high-potential detection path (HD1, HD2) that electrically connects at least one of the first high-potential connection section of the detection block (BMn) at a highest-potential side of the plurality of detection blocks and the second high-potential connection section of the detection block (BM1) at a lowest-potential side of the plurality of detection blocks, and the high-potential input section of the control section; and, a low-potential detection path (LD1, LD2) that electrically connects at least one of the first low-potential connection section of the detection block (BMn) at a highest-potential side of the plurality of detection blocks and the second low-potential connection section of the detection block (BM1) at a lowest-potential side of the plurality of detection blocks, and the low-potential input section of the control section.

According to the second aspect of the embodiment, when the positive electrode side of the detection block and the high-potential input section of the control section are connected, a high-potential common path of the monitoring section can be used as a connection path. In addition, when the negative electrode side of the detection block and the low-potential input section of the control section are connected, a low-potential common path of the monitoring section can be used as a connection path. Hence, the electrical paths configuring the voltage detection apparatus can be shortened, compared with a configuration in which the high-potential input section of the control section is connected to the respective first high-potential connection sections of each of the plurality of monitoring sections by individual high-potential detection paths and in which the low-potential input section of the control section is connected to the respective first low-potential connection sections of each of the plurality of monitoring sections by individual low-potential detection paths.

As a third aspect of the embodiment, the apparatus includes a power supply circuit (60) that is supplied with electric power from an electric power source (70) that is different from the battery cells configuring the assembled battery and generates a power supply voltage. The high-potential switch and the low-potential switch are operated by the power supply voltage generated by the power supply circuit.

According to the third aspect of the embodiment, even if an anomaly has occurred in the battery cell, the high-potential switch and the low-potential switch can be operated by using the power supply voltage generated by the power supply circuit. Hence, even if an anomaly has occurred in the battery cell, the terminal voltage of the detection block can be detected by the sub voltage detection section.

In the third aspect of the embodiment, specifically, as in the case of a fourth aspect, a communication line (CL) is provided which connects the control section and each of the monitoring sections. A configuration can thereby be used in which the control section outputs operating commands for the high-potential switch and the low-potential switch to each of the monitoring sections via the communication line, and each of the monitoring sections operates the high-potential switch and the low-potential switch based on the operation command received via the communication line, using the power supply voltage supplied from the power supply circuit. According to the fourth aspect of the embodiment, control lines for switch control which connect the control section and each of the switches can be reduced.

As a fifth aspect of the embodiment, the control section includes a command outputting section (20) that sequentially outputs closing operation commands for the high-potential switch and the low-potential switch to each of the monitoring sections via the communication line, a detection instruction section (20) that instructs the sub voltage detection section to detect a terminal voltage of the detection block corresponding to the high-potential switch and the low-potential switch that are closed in accordance with the closing operation command, and a specification section (20) that specifies a disconnected portion in the communication line based on the terminal voltages of the detection blocks that are detected by the sub voltage detection section.

If a disconnection has occurred in the communication line connecting the control section and the monitoring section, then even if a closing operation command for the high-potential switch and the low-potential switch is outputted from the control section to the monitoring section via the communication line, the high-potential switch and the low-potential switch in the opened state. In this condition, even if the terminal voltage of the detection block is detected by the sub voltage detection section, the detected value greatly deviates from the normally expected value. Hence, the disconnected portion of the communication line can be specified based on the result of detection of the terminal voltages of the detection blocks by the sub voltage detection section.

In view of this, according to a fifth aspect of the embodiment, closing operation commands are sequentially outputted to the respective monitoring sections via the communication line, and the terminal voltage of the detection block corresponding to the high-potential switch and the low-potential switch closed in accordance with the closing operation command is detected by the sub voltage detection section. Then, the disconnected portion of the communication line can be specified based on the detected terminal voltage of the detection block.

As a sixth aspect of the embodiment, the apparatus includes main detection paths (L1 to L5) that electrically connect a positive electrode side and a negative electrode side of each of the detection target batteries to the monitoring section. The main voltage detection section detects terminal voltages of the detection target batteries via the main detection paths connected to the positive electrode side and the negative electrode side of each of the detection target batteries. An overvoltage protection element (81) is electrically connected between a pair of the adjacent main detection paths, between which the battery cell is interposed, and that maintains a short-circuit condition between the pair of the main detection paths due to a short-circuit failure caused when an overvoltage is applied. Breaking elements (circuit breakers) (82) are provided in each of the main detection paths and interrupt an electrical connection between the detection target battery and the monitoring section, by a short-circuit current flowing between the pair of the main detection paths via the overvoltage protection element when a short-circuit failure of the overvoltage protection element has occurred.

According to the sixth aspect of the embodiment, even when an overvoltage is applied to the monitoring section from the detection target battery, a short-circuit condition is maintained between a pair of detection lines by the overvoltage protection element to which a overvoltage is applied. Hence, the monitoring section can be protected from the overvoltage. In addition, when a short-circuit failure of the overvoltage protection element occurs, a short-circuit current flows between the pair of detection lines via the overvoltage protection element. As a result, the electrical connection between the detection target battery and the monitoring section is interrupted. Accordingly, the monitoring section can be protected from the short-circuit current.

As described above, according to the sixth aspect of the embodiment, since the monitoring section can be protected from an overvoltage, operating of the switches by the monitoring section can be continued. Thus, the detection of terminal voltages of the detection blocks by the sub voltage detection can be continued,

What is claimed is:

1. A voltage detection apparatus suitable for an assembled battery including a series connection of a plurality of battery cells, wherein the series connection including at least two of the battery cells configuring the assembled battery is regarded as at least one detection block of a plurality of detection blocks, the voltage detection apparatus comprising:

a plurality of monitoring sections that each individually correspond to each detection block of the plurality of detection blocks, each monitoring section including battery input sections, a first high-potential connection section, a first low-potential connection section, a high-potential common path that is electrically connected to the first high-potential connection section, a second high-potential connection section that is electrically connected to the high-potential common path, a low-potential common path that is electrically connected to the first low-potential connection section, a second low-potential connection section that is electrically connected to the low-potential common path, and a main voltage detection section that detects a terminal voltage of a detection target battery, the detection target battery being each of the battery cells configuring the at least one detection block or the series connection of the battery cells, where the number battery cells in the series connection is smaller than the number of the battery cells configuring the at least one detection block;

a high-potential electrical path that is provided in the monitoring section and electrically connects the first high-potential connection section and a positive electrode side of the at least one detection block via the battery input section;

a low-potential electrical path that is provided in the monitoring section and electrically connects the first low-potential connection section and a negative electrode side of the at least one detection block via the battery input section;

a control section that includes a high-potential input section electrically connected to the high-potential connection section, a low-potential input section electrically connected to the low-potential connection section, and a sub voltage detection section that detects a voltage difference between the high-potential input section and the low-potential input section as a terminal voltage of the at least one detection block;

a high-potential switch that is provided in the high-potential electrical path to open and close the high-potential electrical path;

a low-potential switch that is provided in the low-potential electrical path to open and close the low-potential electrical path;

a high-potential external path that electrically connects the second high-potential connection section of the monitoring section corresponding to the at least one detection block at a high-potential side of the adjacent detection blocks of the plurality of detection blocks connected in series and the first high-potential connection section of the monitoring section corresponding to the at least one detection block at a low-potential side of the adjacent detection blocks of the plurality of detection blocks connected in series;

a low-potential external path that electrically connects the second low-potential connection section of the monitoring section corresponding to the at least one detection block at the high-potential side of the adjacent detection blocks of the plurality of detection blocks connected in series and the first low-potential connection section of the monitoring section corresponding to the detection block of the plurality of detection blocks at the low-potential side of the adjacent detection blocks connected in series;

a high-potential detection path that electrically connects at least one of the first high-potential connection section of the detection block at a highest-potential side of the plurality of detection blocks and the second high-potential connection section of the detection block at a lowest-potential side of the plurality of detection blocks, and the high-potential input section of the control section; and a low-potential detection path that electrically connects at least one of the first low-potential connection section of the detection block at a highest-potential side of the plurality of detection blocks and the second low-potential connection section of the detection block at a lowest-potential side of the plurality of detection blocks, and the low-potential input section of the control section.

2. The voltage detection apparatus according to claim 1, further comprising a power supply circuit that is supplied with electric power from an electric power source that is different from the plurality of battery cells configuring the assembled battery and generates a power supply voltage, wherein
the high-potential switch and the low-potential switch are operated by the power supply voltage generated by the power supply circuit.

3. The voltage detection apparatus according to claim 2, further comprising a communication line that connects the control section and each of the plurality of monitoring sections, wherein:
the control section outputs operating commands for the high-potential switch and the low-potential switch to each of the plurality of monitoring sections via the communication line, and
each of the plurality of monitoring sections operates the high-potential switch and the low-potential switch by being supplied with the power supply voltage from the power supply circuit based on the operating commands received via the communication line.

4. The voltage detection apparatus according to claim 3, wherein the control section includes:
a command outputting section that sequentially outputs closing operation commands for the high-potential switch and the low-potential switch to each of the plurality of monitoring sections via the communication line;
a detection instruction section that instructs the sub voltage detection section to detect a terminal voltage of each detection block of the plurality of detection blocks corresponding to the high-potential switch and the low-potential switch that are closed in accordance with the closing operation command, and
a specification section that specifies a disconnected portion in the communication line based on the terminal voltages of each of the detection blocks that are detected by the sub voltage detection section.

5. The voltage detection apparatus according to claim 3, further comprising:
a plurality of main detection paths that electrically connect a positive electrode side and a negative electrode side of each of the detection target batteries to each of the plurality of monitoring sections, wherein the main voltage detection section detects terminal voltages of the detection target batteries via the main detection paths connected to the positive electrode side and the negative electrode side of each of the detection target batteries;
an overvoltage protection element that is electrically connected between a pair of adjacent main detection paths of the plurality of main detection paths, between which the battery cell is interposed, the overvoltage protection element maintains a short-circuit condition between the pair of the adjacent main detection paths due to a short-circuit failure caused when an overvoltage is applied, and
a plurality of breaking elements that are provided in each of the plurality of main detection paths and interrupt an electrical connection between the detection target battery and each of the plurality of monitoring sections, by a short-circuit current flowing between the pair of the adjacent main detection paths via the overvoltage protection element when the short-circuit failure of the overvoltage protection element has occurred.

* * * * *